(12) United States Patent
Litt

(10) Patent No.: US 7,096,395 B2
(45) Date of Patent: Aug. 22, 2006

(54) EFFICIENT WORD RECOGNIZER FOR A LOGIC ANALYZER

(75) Inventor: Timothe Litt, Southborough, MA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 656 days.

(21) Appl. No.: 10/034,227

(22) Filed: Dec. 28, 2001

(65) Prior Publication Data

US 2003/0126502 A1 Jul. 3, 2003

(51) Int. Cl.
*G01R 31/28* (2006.01)
(52) U.S. Cl. ....................................... 714/724
(58) Field of Classification Search ................... 714/30, 714/38, 39, 724, 726, 727, 732, 733
See application file for complete search history.

(56) References Cited

U.S. PATENT DOCUMENTS 6,633,838 B1 * 10/2003 Arimilli et al. ............... 703/16

* cited by examiner

*Primary Examiner*—James C. Kerveros

(57) ABSTRACT

A system having multiple on-chip logic analyzers (OCLA), each on-chip logic analyzer includes one or more word recognizers. The word recognizer includes a great deal of flexibility for the user, while being capable of implementation with very few gates. The word recognizer includes a Boolean logic portion in which a plurality of conditions can be dynamically segregated into a mutually exclusive set of groups. The conditions in each group are combined by means of a single Boolean function that is programmable. The resultant term (or product) from each group is combined with those of the other groups by a fixed selection of Boolean functions. The output of the Boolean logic section is provided to a counter/timer.

8 Claims, 6 Drawing Sheets

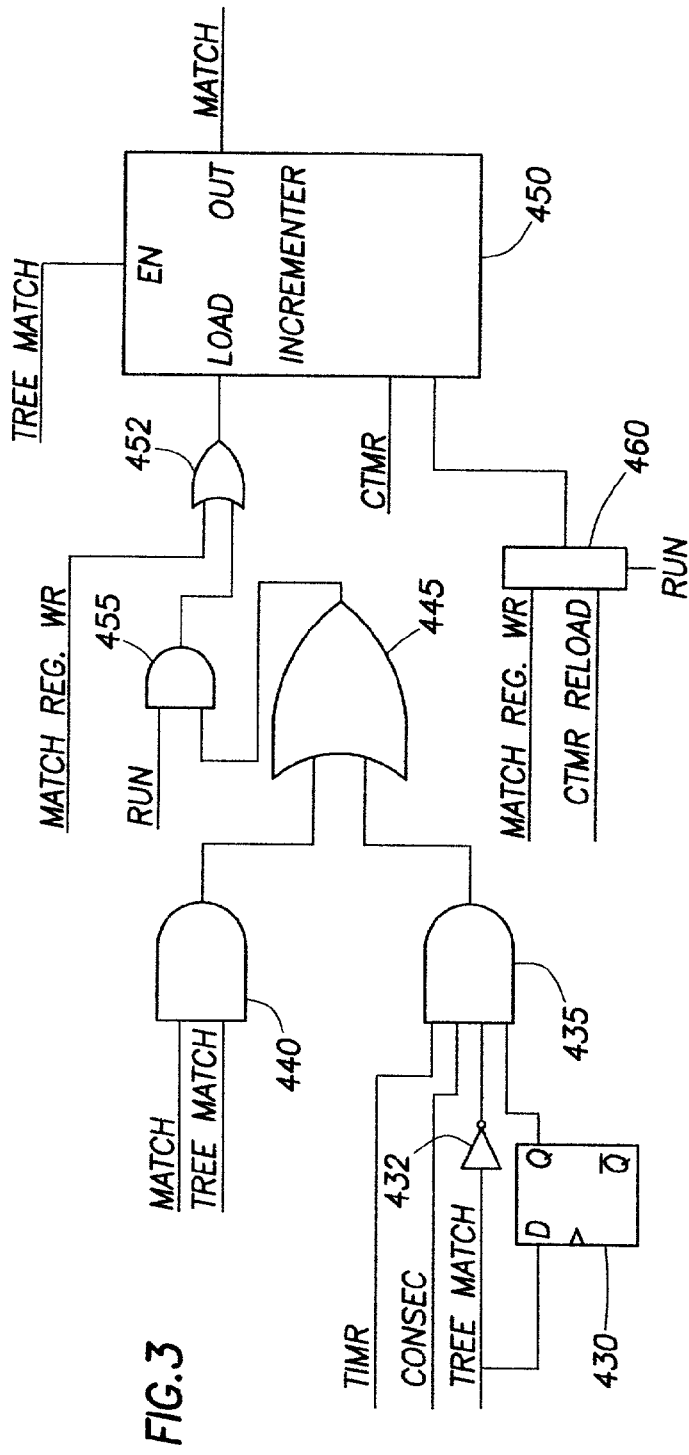
FIG.3
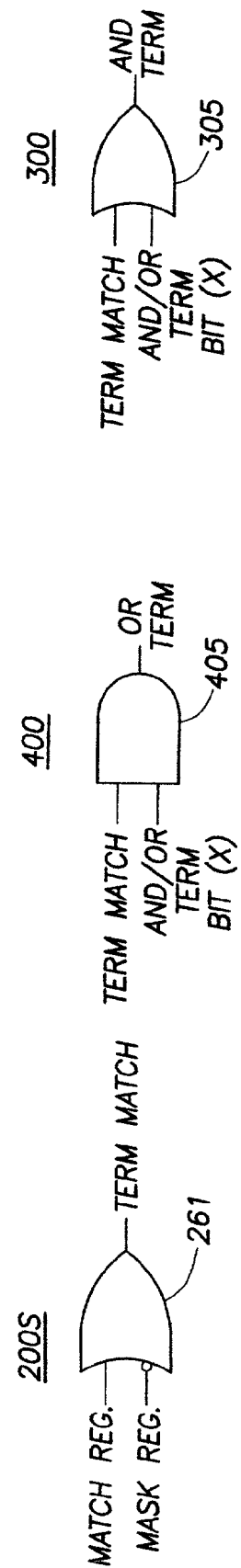
FIG.7
FIG.6
FIG.5

EFFICIENT WORD RECOGNIZER FOR A LOGIC ANALYZER

CROSS-REFERENCE TO RELATED APPLICATIONS

This application relates to the following commonly assigned co-pending applications entitled:

Method And Apparatus For Efficiently Implementing Trace And/Or Logic Analysis Mechanisms On A Processor Chip, Ser. No. 10/034,717, filed Dec. 28, 2001 Method And Apparatus For Managing Timestamps When Storing Data, Ser. No. 10/034,462, filed Dec. 28, 2001; and Method And Apparatus For Implementing Loop Compression In A Program Counter Trace, Ser. No. 10/034,506, filed Dec. 28, 2001, now U.S. Pat. No. 6,691,207 issued Feb. 10, 2004.

all of which are incorporated by reference herein.

STATEMENT REGARDING FEDERALLY SPONSORED RESEARCH OR DEVELOPMENT

Not applicable.

BACKGROUND OF THE INVENTION

1. Field of the Invention

The present invention relates generally to logic analyzers that are used to facilitate the design of digital logic devices. More preferably, the present invention relates to an on-chip logic analyzer capable of receiving internal state data of a digital logic device, and of selecting a portion of that internal state data for storage in a historical log. Still, more particularly, the invention relates to a word recognizer for an economical on-chip logic analyzer, which permits filtering of internal state data to select information for storage that is of particular interest during debugging operations.

2. Background of the Invention

The design and development of digital logic circuits has become increasingly complex, due in large measure to the ever-increasing functionality offered in such circuits. Integrated circuits are constantly surpassing milestones in performance, as more and more functionality is packaged into smaller sizes. This enhanced functionality requires that a greater number of transistors be included in an integrated circuit, which in turn requires more rigorous testing requirements to insure reliability once the device is released. Integrated circuit designs are repeatedly tested and debugged during the development phase to minimize the number and severity of errors that may subsequently arise. In addition, chips may be tested to determine the performance characteristics of the device, including the speed or throughput of the chip, software running on the chip, or the aggregate performance of the system.

As integrated circuits become more complex, the length of the increases, requiring a greater lead-time before product release. In addition, as the complexity of integrated circuits increase, it becomes necessary to fabricate more prototype iterations of the silicon (or "spins" of silicon) in order to remove successive layers of bugs from the design, thereby increasing the engineering and material cost of the released product. It would be desirable to reduce these engineering and material costs and speed up the product cycle. Moreover, if the most relevant state data was available for analysis by the debugging team, the debugging phase for products could be reduced significantly, thereby minimizing cost, and enabling an earlier product launch.

One of the chief difficulties encountered during the debug phase of a product is identifying the source of an error, and obtaining relevant data regarding the conditions existing at the time of the error. This can be extremely difficult because the error may make it impossible to obtain state information from the integrated circuit. For example, in a processor, an error may cause the processor to quit executing, thus making it impossible to obtain the state data necessary to identify the source of the error. As a result, the debug process often unfortunately requires that the debug team infer the source of the error by looking at external transactions at the time of the error, instead of being able to look at the internal state data. The normal technique for probing external busses is to solder a wire onto a terminal or trace. Unfortunately, merely adding a soldered wire to a terminal or trace can create signal reflections, which may distort the data being monitored. Thus, the manual probing of bus terminals and traces is impractical and inaccurate, especially those attached to high speed, highly complex chips. More sophisticated techniques are also used, but are expensive and suffer, albeit to a lesser degree, from the same effects. Further, because the state information available on these busses is typically a small subset of the processor's state, the debug team must make guesses regarding the state of data internal to the processor. If the internal state of the processor could be acquired and stored, these inferences would be replaced by solid data. By reducing the designer's uncertainty and increasing the available data, this would be beneficial in solving problems with the processor hardware or software.

In certain products under development, such as new microprocessors under development by the assignee of the present invention, the number of transistors is exceedingly large and their dimensions are exceedingly small. Both of these factors make it practically impossible to probe internal terminals of the chip or internal wire traces. Moreover, to the extent that certain internal terminals and traces could be probed, the conventional methods for conducting such a probing operation are extremely expensive, and some might potentially corrupt the state of the terminals and traces being probed. Consequently, the only common technique currently available to test or probe the state of terminals and traces in highly complex chips is to route signals through the chip's external output terminals, to some external interface. This approach, however, suffers in several respects.

First, as noted above, the signals obtained from the external output terminals are removed from the signal states of the internal terminals and traces. Thus, this technique requires the debugging team to infer the state of the internal terminals and traces from signals appearing on an external bus. Second, routing the desired state to external terminals often requires more wiring, silicon, drivers, pads and power than is affordable. Attempts to do so can compromise the normal functioning of the chip. And costs escalate throughout the design, often impacting the micropackaging and system board as well as the die. Third, oftentimes the internal clock rate of the chip operates at a much higher rate than the external logic analyzers that receive and process the data. As an example, processor designs currently under development operate at clock speeds up to and exceeding 2.0 GHz. The fastest commercial logic analyzers, despite their expense, are incapable of operating at GHz frequencies. Thus, either certain data must be ignored, or some other mechanism must be employed to capture the high-speed data being generated on the chip. The typical approach is to run the chip at a slower clock speed so the data can be captured by external test equipment. This solution, however, makes it more difficult to detect the bugs and errors that occur when the chip is running at full clock speeds. Some errors that occur at full clock speed will not be detected when the clock speed if reduced to accommodate the off-chip logic analyzers. Also, increasingly the processor connects to external components that have a minimum speed, below which they will not operate. These speeds require the processor to operate faster than the external logic analyzer can accommodate.

As an alternative to sending data off-chip, attempts have been made to capture certain state data on chip, thereby reducing the problems of interfacing slower speed test equipment with high-speed devices. In the past, to the extent that designers sought to incorporate memory onto the chip for debug and test purposes, dedicated memory devices (usually RAM) were used. Thus, in prior art designs that attempted to capture debug and test information on-chip, a dedicated memory structure was incorporated into the chip design solely to store data for the debug and test modes. The problem with this approach, however, is that it requires the allocation of a significant amount of chip space to incorporate such dedicated memory devices, and these memory devices, while used extensively during the design and development phase of the chip, add little or nothing to the performance of the chip once it is released into production. Thus, the inclusion of dedicated memory space on the chip represents an opportunity cost, and means that functionality and/or performance is sacrificed to include this dedicated memory on the chip. Consequently, the inclusion of memory for debug purposes, while helpful in the debug and test phase, is generally viewed as undesirable because of the accompanying loss of performance and functionality that must be sacrificed. If a dedicated memory device is included on the chip, system designers normally require that such a memory be very small in size to minimize the cost increase (silicon cost is an exponential function of area, and memories are large structures), as well as the performance and functionality loss that accompanies the inclusion of such a dedicated memory. As the size of the dedicated memory becomes smaller, so too does the prospect that the state information stored in the dedicated memory will be sufficient to assist in the debug process. Thus, as the dedicated memory space becomes smaller, so too does the probability that useful debug data will be captured. In relative terms, the largest dedicated on-chip memories typically are incapable of storing very much data.

In assignee's co-pending application entitled Method And Apparatus For Efficiently Implementing Trace And/Or Logic Analysis Mechanisms On A Processor Chip, (Invention Disclosure P01–3848), the teachings of which are incorporated herein, the on-chip cache memory is used to store data from the on-chip logic analyzer. The use of the on-chip cache memory as a storage device for the on-chip logic analyzer permits the storage of a relatively large amount of state data on the chip as compared to previous designs. While the use of the on-chip cache memory greatly expands the amount of state data that can be stored on-chip, the extent of data that can be stored is not limitless. For a processor operating at 2 GHZ, the amount of data that can be stored in a 256 Kbyte cache represents only a few microseconds of data. Consequently, if the OCLA stores all incoming internal state data in the cache, the cache would quickly overflow, and potentially relevant data would be overwritten, or ignored.

External logic analyzers often include a word recognizer that functions a filter to select samples and/or operates as a trigger to start or stop acquisition. The word recognizer usually is implemented as a programmable logic device, which permits a system debugger to input state equations of interest, and the programmable logic device then compares incoming test data for matching state conditions. Internal state data occurring immediately after such a match can then be stored for later analysis. The ability to automatically monitor for certain conditions or events is beneficial because of the huge quantities of information that are generated by complex integrated circuits, and the high clock speeds of those devices. By the time that a user detects an interesting condition and presses a button, a processor may have generated gigabytes of data. The word recognizer thus provides a powerful tool for a system debugger because it permits a historical log to be generated almost instantaneously with the occurrence of a particular condition. More advanced word recognizers may provide selective masking of user-programmed values and counters and timers The ability to have such multi-level word recognizers and counter and timers is important for effective debug of complex logic, such as high-speed processors. Unfortunately, implementing a full-feature word recognizer and associated counters and timers has been viewed as unfeasible on the chip itself because of the large number of wires, logic devices and processing time that such devices would require. Thus, a full-feature word recognizer, capable of implementing arbitrary Boolean equations, typically is viewed as cost prohibitive to include on-chip. The absence of a full-feature word recognizer in existing on-chip logic analyzers makes it much more difficult to debug a design, thus introducing additional time and money to the development of new processors and complex integrated circuits. As an example, a system debugger may want to analyze state data being generated in the chip when certain combination of events occur—such as when a particular software instruction is executing (which can be determined by the address of the executing instructions), and when write transactions are occurring to a particular chip resource. If a device could be implemented that could examine internal state data, and only store state data on-chip when both conditions occur, then highly relevant state data would be available for the system debugger to use in analyzing and correcting the error.

It would be desirable if a system or technique was developed that would permit most of the useful features of a word recognizer to be included as part of an on-chip logic analyzer. It would also be advantageous if an economical, yet powerful, word recognizer could be developed that could be included on-chip without unduly raising the cost of the final product. Despite the apparent advantages such a design would offer, to date no such product has developed.

BRIEF SUMMARY OF THE INVENTION

The problems noted above are solved in large part by one or more on-chip logic analyzers that include one or more word recognizers that can be programmed by a user to monitor a variety of values and conditions regarding the internal state data of the chip. The word recognizer accommodates a great deal of flexibility to allow various conditions and events to be combined together and compared separately or in conjunction to initiate storage of state data, while consuming a relatively small amount of space in the chip. The word recognizer can be implemented with a minimum of logic, and thus consumes relatively little pace on the chip. The word recognizer is configured in two portions. The first portion comprises a Boolean logic section that enables the user to specially configure the match conditions that will trigger data acquisition and/or data storage in an on-chip memory device. The second portion of the word recognizer comprises a counter/timer, which permits the user to count the number of times a match condition occurs, or the amount of time that the match condition exists (either for a single match condition, or cumulatively for all match conditions).

According to one aspect of the present invention, an on-chip word recognizer is configured to look for certain conditions or combination of conditions created during the operation of an integrated circuit, as reflected by the internal state signals of the integrated circuit, or of software based conditions. When the particular condition or combination of conditions is detected in the internal state data or in software conditions, the word recognizer may then start storing data or stop storing data in an on-chip memory, such as a cache set. The word recognizer also preferably includes a counter and timer to enable particular conditions to be counted, or to permit a time period to be counted after a particular condition, and to make decisions regarding data storage based on the count/timer values in conjunction with match conditions. Thus, the word recognizer is designed as an extremely flexible device for determining which pieces of incoming state data to save in memory, and which pieces to discard.

According to another aspect of the present invention, the word recognizer of the present invention includes a Boolean logic portion in which a plurality of conditions can be dynamically segregated into a mutually-exclusive set of groups; where the conditions in each group are combined by means of a single Boolean function (notably AND or OR) that is pre-determined (fixed by implementation) for each group; and where the resultant term (or product) from each of the groups is combined with those of the other groups by a fixed selection of Boolean functions. For example, in one embodiment of the present invention, two groups are defined: a group whose conditions are combined by the AND Boolean function, and a second group whose conditions are combined by the OR Boolean function. Conditions are dynamically (per debug-session) assigned to either the first or second group. A condition which is active in the first group, is not considered in the second group; this is what is meant by "mutually exclusive groups." The result of applying the AND function to the first group is combined with the result of combining the OR function to the second group, using one of the AND, OR, NAND or NOR operations. The choice of operation is again dynamic. Without changing the essence of the invention, as resources allow, the number of groups can be increased (e.g., an XOR group could be added), and/or the number of combining functions increased (e.g., XOR/EQV could be added to the combining functions.).

The present invention permits the incorporation of a relatively powerful word recognizer in an on-chip logic analyzer by constructing the word recognizer with some relatively basic Boolean functions, such as AND and OR gates, and some selection logic. The use of these simple gates, instead of a full-featured programmable logic device, permits the word recognizer to be designed in an extremely small space, at a very economical cost, thereby making it possible to include it on-chip. The word recognizer permits the recognition of both hardware and software terms, and retains a large measure of user flexibility in defining the conditions of interest.

In accordance with a preferred aspect of the present invention, one or more word recognizers are provided on-chip as part of an on-chip logic analyzer. Each of the word recognizers preferably is user programmable by a user in one or more configuration registers. For example, the user preferably specifies the internal state values that will satisfy the word recognizer's match control conditions. In addition, the user specifies how the values are to be combined, counted and/or timed to form the acquisition word recognizer's final match condition. The user also includes a count value that is loaded in the counter/timer. The user defines which match bits are to be compared with internal state data for the match conditions. In addition, the user includes a count value that is re-loaded in the counter/timer once the counter/timer satisfies the initial count value.

The Boolean match condition logic section is divided into two groups, according to bits programmed by the user into one or more configuration registers. The members of one group are combined with an AND function, while the members of the other group are combined with an OR function. Depending on the Match type bits programmed by the user, the results of the AND and OR functions then are combined with either an AND, OR, NAND, or NOR function. The output signal from this function controls a configurable counter/timer, which preferably is 32-bits wide. When the OCLA starts acquiring data, the counter/timer is programmed with a value specified by a CTMR field in the configuration registers. The counter/timer then counts up to zero. When the counter/timer reaches zero, the word recognizer's final match condition is considered satisfied, and the counter/timer is reloaded with the value programmed in the CTMR field.

The configuration registers preferably include a timer bit field (TIMR), which determines if the counter/timer will count events or clock cycles. If the TIMR bit is clear, the counter/timer counts events. An event occurs in the cycle that the word recognizer's control condition transitions from false to true, indicating a match has occurred between the internal state data and the match conditions programmed by the user. Each transition increments the counter by one, until it reaches zero. If, conversely, the TIMR bit is set, the counter/timer counts the number of clock cycles during which the word recognizer's control condition is true.

The configuration registers also preferably include a consecutive/accumulated bit field (CONSEC), which determines if the counter/timer counts total clock cycles or consecutive clock cycles when the TIMR bit is set. If CONSEC is clear, the counter/timer increments by one in every cycle that its word recognizer's control condition is true and it holds its value otherwise. When CONSEC is clear, it permits the word recognizer to evaluate the total number of cycles that the condition is true, regardless of any cycles in which the condition is false. If the CONSEC bit field is set, the counter/timer increments by one in every cycle that the word recognizer's control condition is true. When the word recognizer's condition turns false, the counter/timer value is reloaded with a second value programmed by the user in the configuration registers. Thus, when CONSEC is set, the counter/timer evaluates the total number of consecutive cycles that the match condition is true.

These and other aspects of the present invention will become apparent upon reading the detailed description of the preferred embodiment and the appended claims.

BRIEF DESCRIPTION OF THE DRAWINGS

For a detailed description of the preferred embodiments of the invention, reference will now be made to the accompanying drawings in which:

FIG. 3 is a schematic illustration of the portion of the word recognizer of FIG. 1 that performs timer and counter functions;

FIG. 5 is a schematic illustration of the software matcher of FIG. 2;

FIG. 6 is a schematic illustration of the OR-TERM of FIG. 2;

FIG. 7 is a schematic illustration of the AND-TERM of FIG. 2;

NOTATIONS, NOMENCLATURE AND INTERPREATIONAL ISSUES

Certain terms are used throughout the following description and claims to refer to particular system components. As one skilled in the art will appreciate, computer and microprocessor manufacturers and fabrication houses may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the terms "couple," "couples," "connect," and "connects" are intended to mean either an indirect or direct electrical connection. Thus, if a first device "couples" to a second device, that connection may be through a direct electrical connection, or through an indirect electrical connection via other devices and connections. The terms "microprocessor" and "processor" are used interchangeably to refer to an integrated circuit that contains logic elements for manipulating data and for making decisions based on executable software. It should be understood that although the present invention is described in the context of the preferred embodiment, which is implemented as a processor, the present invention has broader application and can be used with any digital logic device that includes on-chip memory, and which must either be debugged or tested prior to release. Thus, the present invention and claims should not be limited to a microprocessor only, unless so specified expressly in the claims. It should also be understood that there are multiple aspects to the invention disclosed herein, and that these aspects may independently merit patentability. Thus, if the claims do not expressly include a feature of the present invention, the intent is that any omitted features not form part of the claim, and that the claim instead focuses on some other aspect of the invention.

DETAILED DESCRIPTION OF THE PREFERRED EMBODIMENTS

Figure 1:
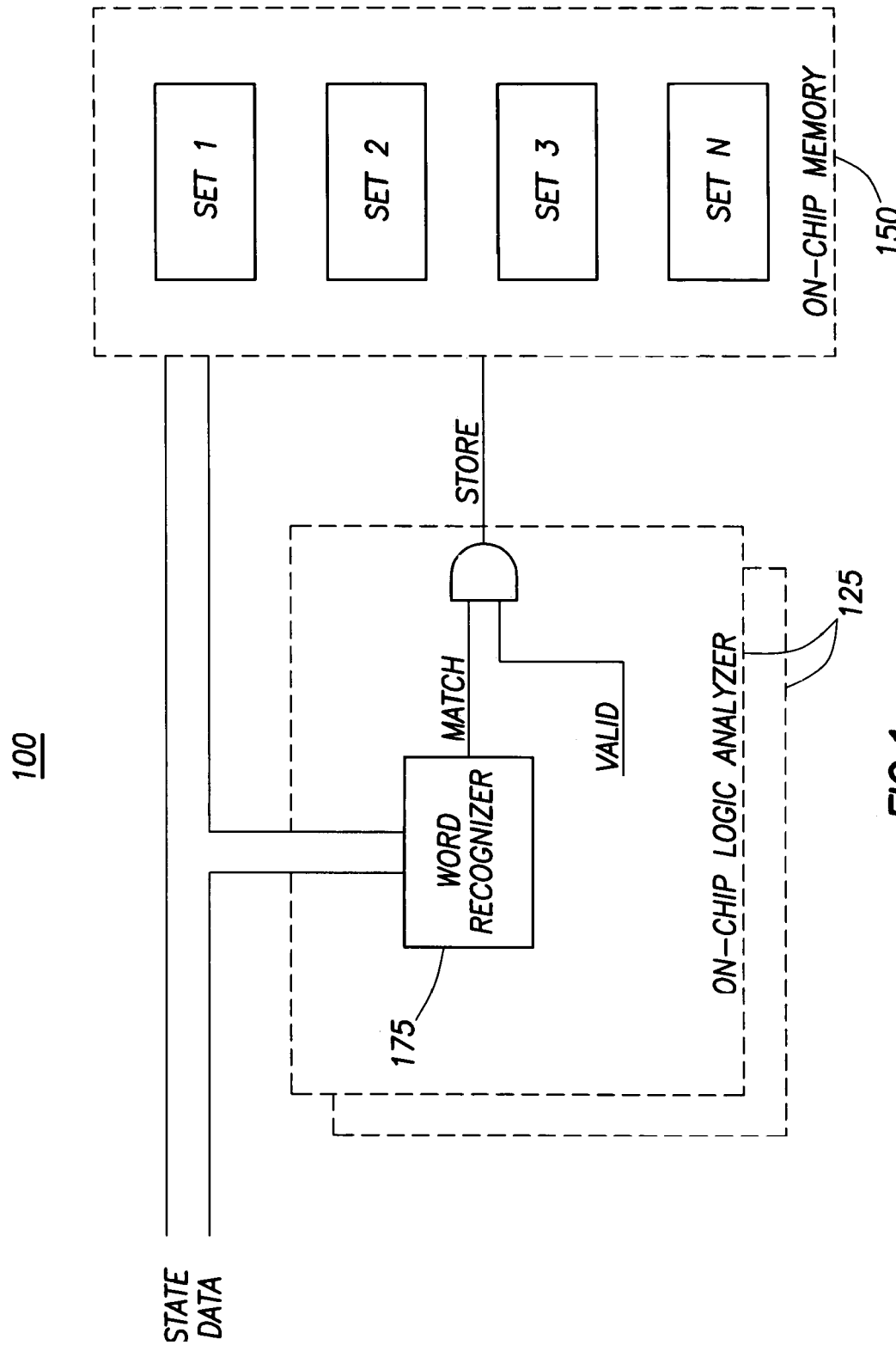
FIG. 1 shows an integrated circuit constructed in accordance with the preferred embodiment that includes an on-chip logic analyzer with a word recognizer, and an on-chip memory for storing internal state data in response to particular conditions or events detected by the word recognizer.

Referring initially to FIG. 1, the present invention constructed in accordance with the preferred embodiment generally comprises an integrated circuit 100 that includes one or more on-chip logic analyzers 125 coupled to an on-chip memory device 150. In accordance with the preferred embodiment, the on-chip memory device 150 comprises an on-chip cache memory, and the integrated circuit comprises a processor. Various other devices may reside on the processor, including without limitation a memory controller (not shown) that controls accesses to a system memory (not shown), an I/O interface (not shown), and various other logical devices that interface with other components normally implemented in a computer system. In addition, the processor may be designed to operate in a multiple processor environment, and thus may include one or more interfaces for coupling to other processors in a computer system.

The cache memory 150 preferably comprises a cache memory located on-chip, although it should be understood that the on-chip logic analyzer of the present invention may be implemented in instances where no cache memory is available for storage of internal state data. According to the exemplary embodiment, the cache memory 150 is segmented into a plurality of cache sets. N such cache sets are shown in FIG. 1 to indicate that the number of cache sets included in the cache memory 150 may vary as desired by the system designer. Each of the cache sets stores multiple lines of data, and each line of data comprises four doublewords, with each doubleword including 32 bits. Thus, each line in a cache set has 128 bits for storing data, plus any error checking and correction (ECC) bits. According to the exemplary embodiment, one or more of the cache sets may be disabled and used exclusively by the on-chip logic analyzer 125 during periods when the integrated circuit 100 is in a debug mode. During other periods when the integrated circuit is functioning in a normal operational mode, the cache sets are all used by the core logic of the integrated circuit to maximize performance. Thus, one or more of the cache sets may be selectively placed under the ownership of the on-chip logic analyzer. When the chip is placed in a debug mode, the disabled cache set stores internal state data selected by the on-chip logic analyzer 125, which subsequently can be retrieved by the user and analyzed as part of the debug process.

The on-chip logic analyzer (OCLA) 125 is specifically designed to facilitate the debugging of the processor both during the design and development phase, and during use in the field by customers. Thus, according to the preferred embodiment, the OCLA 125 includes logic for more efficiently debugging the chip hardware and any software that is executing on the processor. Although shown in the block diagram of FIG. 1 as being located within a single location, it should be understood that the logic for OCLA 125 (and other logic shown in FIG. 1) may be distributed throughout the chip.

Referring still to FIG. 1, the OCLA 125 preferably receives data regarding the state of various hardware devices, and the address of software instructions being fetched and/or executed in the core logic of the integrated circuit 100. Thus, according to the preferred embodiment, the OCLA 125 may couple to various local busses in the integrated circuit, and may also connect directly to certain logical devices within the integrated circuit to receive internal state data reflecting the operation of the core logic in the integrated circuit.

According to the preferred embodiment, the OCLA 125 preferably is capable of filtering the state data it receives from the core logic in the integrated circuit, and of selecting the data to be stored in the on-chip memory device 150. The OCLA 125 may include various logical units that permit the OCLA 125 flexibility in filtering and selecting useful data, in a manner analogous to an external logic analyzer. According to the preferred embodiment of the present invention, multiple OCLAs 125 may be provided on-chip. Each OCLA 125 preferably includes two word recognizers 175 that compare internal state data to certain programmable conditions or events, and issues a match (MATCH) signal when a particular condition or event is detected. In the preferred embodiment, one of the word recognizers triggers the acquisition of internal state data, while the other controls the data that is stored by the OCLA 125. The MATCH signal of the trigger word recognizer controls acquisition of state data. The MATCH signal of the storage word recognizer controls per-sample storage of state data. In addition, each word recognizer's MATCH signal preferably is available as a condition to the corresponding word recognizer in any other OCLAs provided on-chip. Also, the MATCH signal is available to all of the OCLAs on-chip as internal state data that can be stored. Further, according to the preferred embodiment, the MATCH signal is provided as an output of the chip.

Thus, the word recognizer 175 is used to trigger data acquisition or to control the data that is stored during acquisition. For purposes of simplicity, only one word recognizer 175 is shown in the drawings, with the understanding that multiple word recognizers may be provided in each OCLA, with each performing different functions.

Figure 2A:
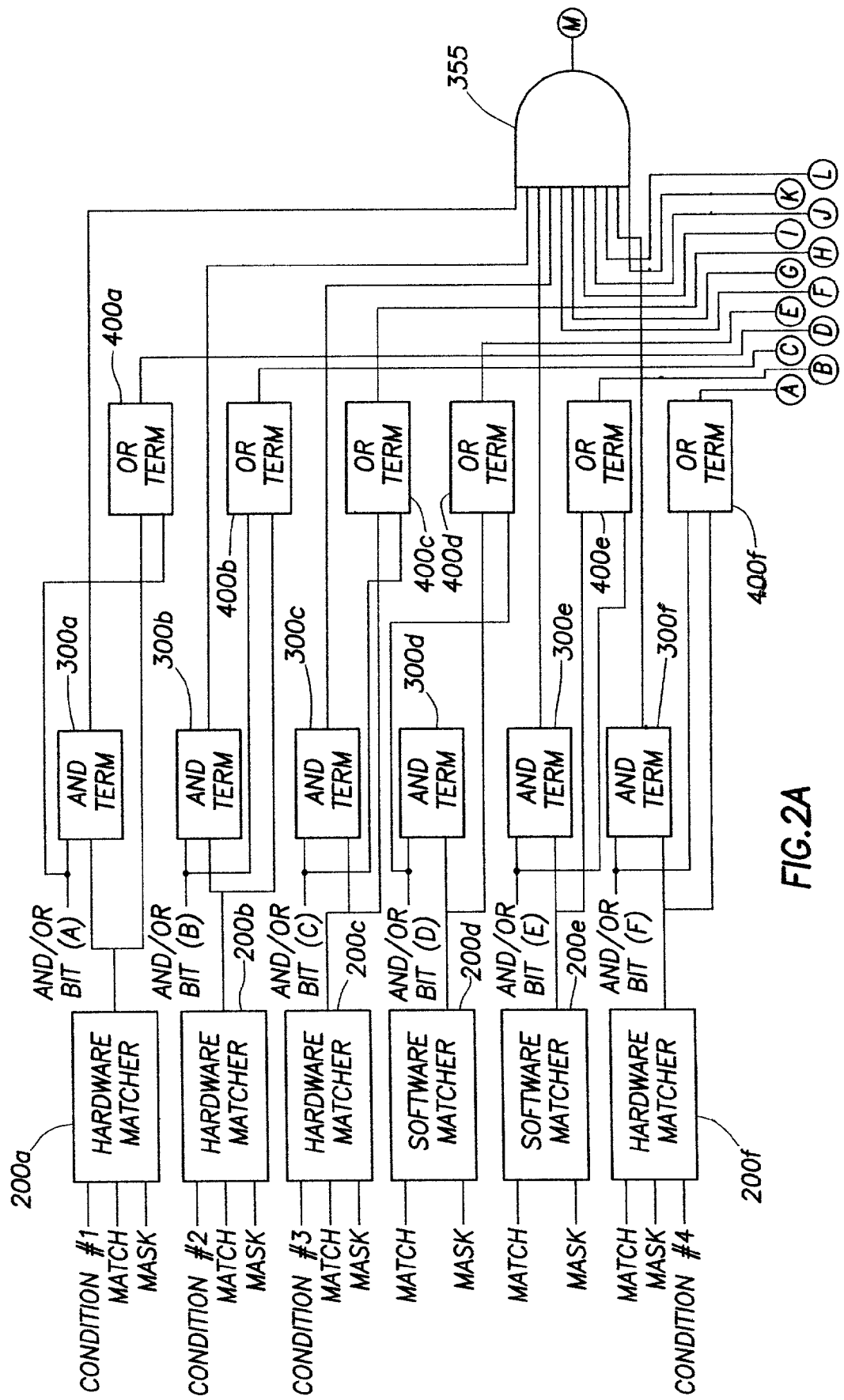
FIG. 2 is a schematic illustration of the portion of the word recognizer of FIG. 1 that performs the match functions.
Figure 2B:
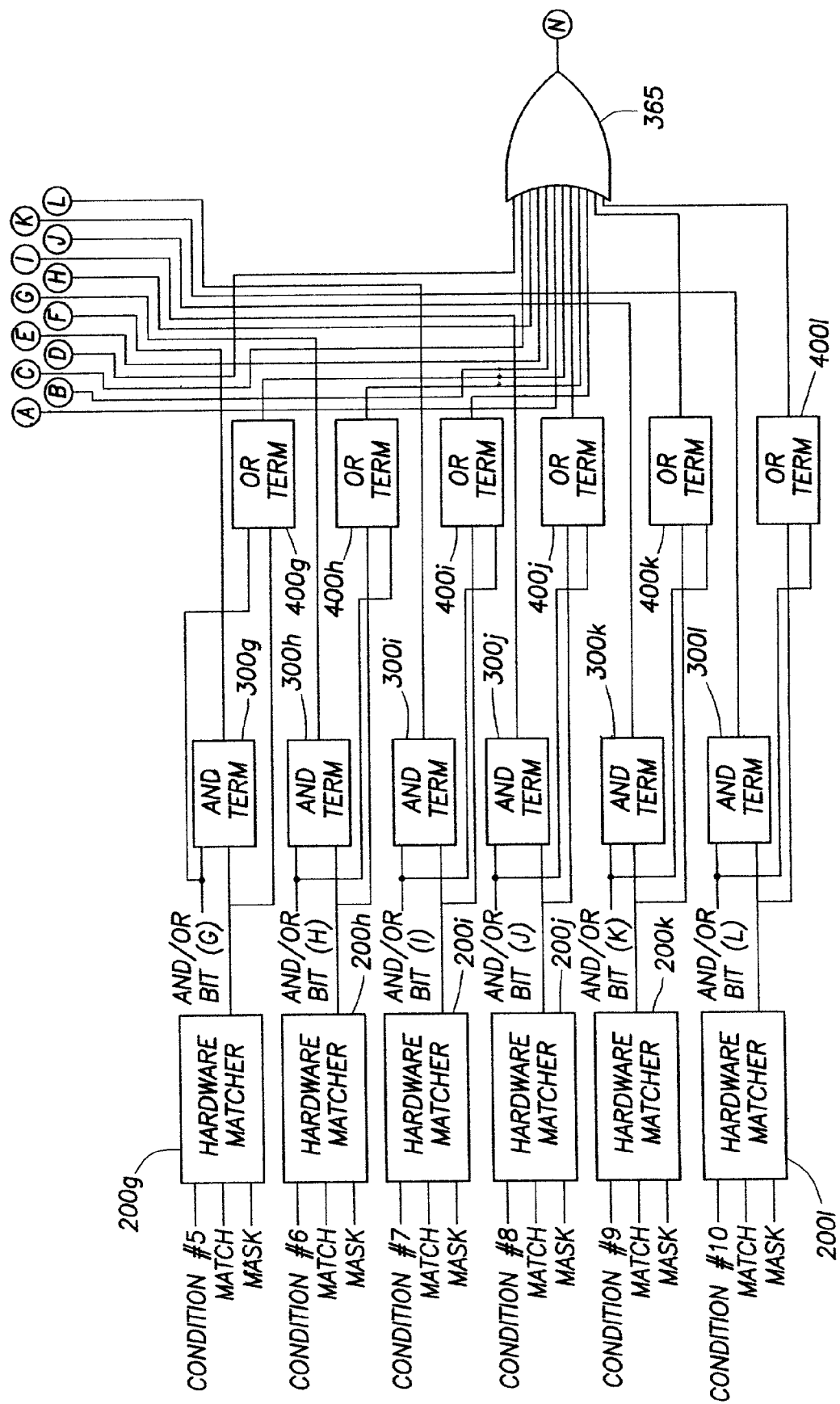
Figure 2C:
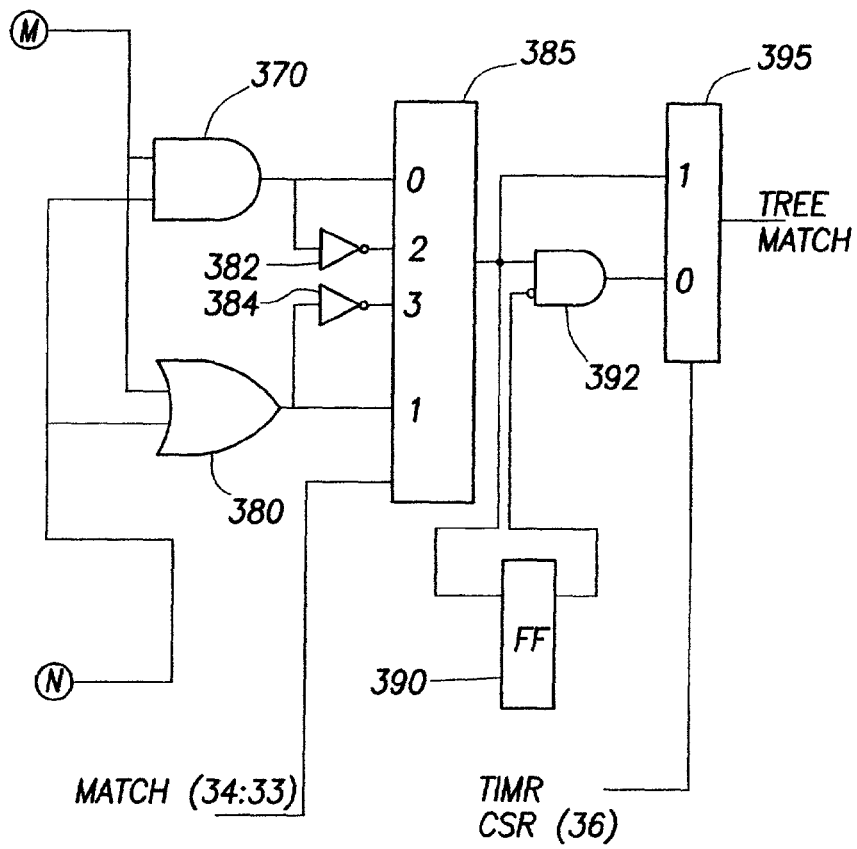

According to one aspect of the present invention, the word recognizer 175 is implemented primarily in hardware constructed of relatively few logic gates, while still providing a great amount of flexibility to the system debugger to enable the debugger to define various conditions or events that are of interest in resolving errors. As a result, the on-chip word recognizer 175 constitutes a relatively powerful debugging tool, while occupying a relatively small amount of space. Referring now to FIGS. 2 and 3, the preferred embodiment of the word recognizer 175 is shown as comprising two portions. The circuitry depicted in FIG. 2 comprises a Boolean logic section that performs the match and mask functions of the word recognizer and permits the match conditions to be combined together using various Boolean logic functions. The circuitry in FIG. 3 performs timer and count functions to provide more sophisticated functionality when used in association with the match logic of FIG. 2.

Figure 8A:
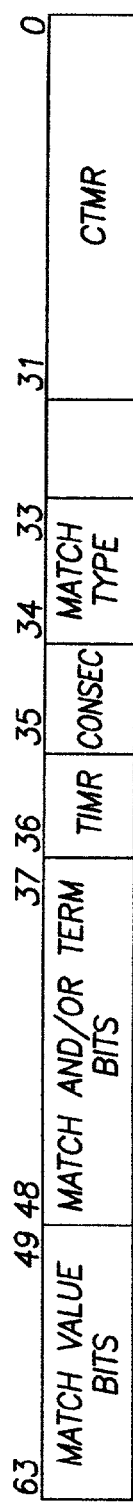
FIG. 8A illustrates the Match Configuration and Status Register that controls the operation of the match conditions of the word recognizer.

Referring now to FIG. 2, a plurality of match logic units 200a–200l preferably are provided as part of the Boolean logic section of the word recognizer 175. The number of match logic units is discretionary. According to the preferred embodiment, two basic types of match logic are used which consist of a hardware matcher and a software matcher. In the exemplary embodiment depicted in FIG. 2, match logic units 200a, 200b, 200c, 200f, 200g, 200h, 200i, 200j, 200k, 200l comprise hardware matchers, while match logic units 200d, 200e form software matchers. It should be understood, however, that any desired combination of hardware matchers and software matchers can be included in the word recognizer 175 to enable the user to define conditions and events of interest. Thus, the particular combination of hardware and software matchers is not intended to be a limiting factor of the present invention. Each of the hardware and software matchers preferably is used to analyze a particular data source for the occurrence of a condition or event. The condition or event can be programmed by a user in a configuration register, such as the Match Configuration and Status Register (Match CSR) 225, which is shown in FIG. 8A, and which couples to one or more of the input terminals of the match logic units 200a–200l. Thus, as an example, hardware matcher 200a may be configured to receive internal state data relating to the program counter of a processor. The internal state data from the program counter then is compared by hardware matcher 200a with a specific condition that is identified by a pattern of 0s and 1s by the user in the Match CSR.

Figure 8B:
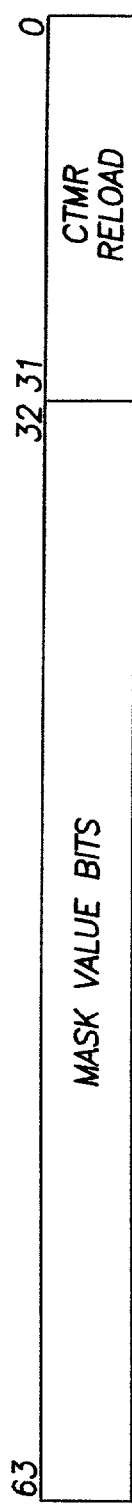
FIG. 8B illustrates the Mask Configuration and Status Register that determines which bits are considered in the word recognizer's match control conditions.

To provide greater flexibility, a Mask Configuration and Status Register (Mask CSR) 235 also may be provided, as shown in FIG. 8B, to identify which bits of the match value condition should be compared with the incoming state data. According to the preferred embodiment, a bit of the Match CSR and a bit of the Mask CSR are coupled to each of the match logical units 200a–200l. In the case of the hardware matchers, a match value register 245 (FIG. 8C) and a mask value register 255 (FIG. 8D) preferably are programmed by the user to indicate the match value and mask value that is of interest. These match and mask values are then used for comparison with the incoming data stream from a particular internal hardware device. Separate match and mask value registers may be provided for each of the hardware matchers of FIG. 2.

Figure 4:
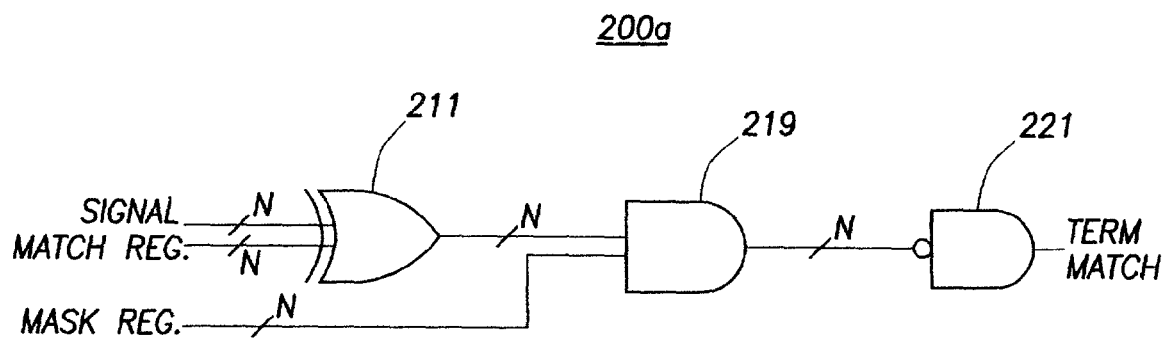
FIG. 4 is a schematic illustration of the hardware matcher of FIG. 2.
Figure 8C:
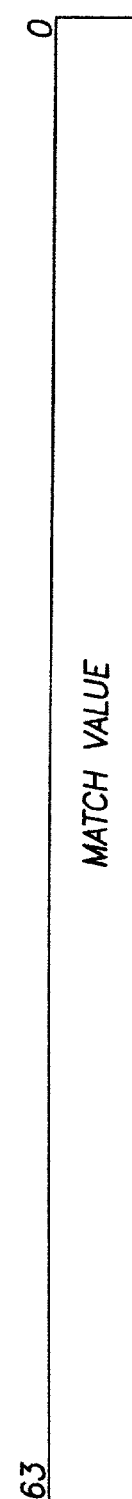
FIG. 8C illustrates a Trigger Match Register in accordance with the preferred embodiment of FIG. 2.
Figure 8D:
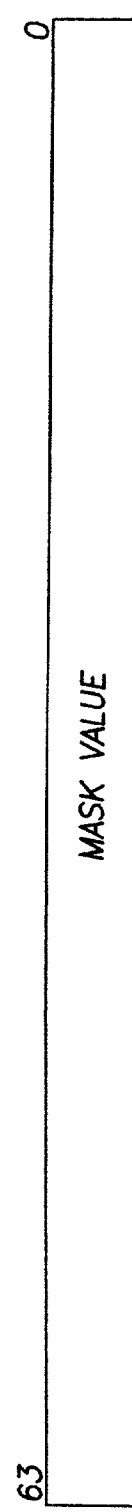
FIG. 8D illustrates a Trigger Mask Register in accordance with the preferred embodiment of FIG. 2.

According to the preferred embodiment of FIG. 4, the hardware matchers are identically constructed. Referring to FIG. 2, each of the hardware matchers receives internal state data and determines if the internal state data matches a programmed value. The hardware matcher is enabled by a match register control bit and a mask register control bit. The match register control bit preferably comprises one or more bits from the Match Configuration and Status Register depicted in FIG. 8A, which are programmed by the user. Thus, for example, bit 63 of the Match CSR may indicate if the hardware matcher 202a is enabled for operation. If enabled by the dedicated bit of the Match CSR, the hardware matcher compares the incoming state data with a programmed match value. The match values preferably are programmed in a match register 245, as shown in FIG. 8C. In similar fashion, the mask register control bit preferably comprises one or more bits from the Mask Configuration and Status Register depicted in FIG. 8B. Thus, again as an example, bit 63 of the Mask CSR may indicate if the hardware matcher 202a has been enabled with a masking function. If enabled for masking, the hardware matcher implements a mask that is defined by a trigger mask value or storage filter mask value. The mask value is programmed in mask register 255, as shown in FIG. 8D. The manner in which the match values and mask values are compared with the internal state data will now be described, assuming both are enabled by the match and mask control bits.

Referring now to FIG. 4, the hardware matcher logic 200 preferably comprises a multiple-bit exclusive-OR gate 211 coupled to a multiple-bit AND gate 219. The output of the multiple-bit AND gate 219 connects to AND gate 221. The AND gate 221 has N inverting inputs, which are combined in an AND function to produce a single-bit truth value, based on the value of the state data, the match value, and the mask value. As an alternative to an AND gate with inverting inputs, gate 221 may also be considered as a NOR gate with N inputs.

The exclusive-OR gate 211 compares each bit of the incoming state data (which has a predefined length, such as 64 bits) with the match value stored in the match register 245, and produces a 64-bit output indicating if a match occurs as to each of the 64-bits. A match is indicated by a "0" output value, while a no match condition is indicated by a "1" output value. Thus, for example, if bit 0 of the trigger match value is a "1" and bit 0 of the internal state data is a "1", then exclusive-OR gate 211 will produce a "0" on its bit 0 output line, indicating a match of bit 0. If bit 1 of the match register is a "0", but bit of the internal state data is a "1", then the exclusive-OR gate 211 will produce a "1" on its bit 1 output line indicating there is no match for bit 1. This comparison preferably occurs concurrently as to each of the 64-bits and the exclusive-OR gate produces a 64-bit output that reflects this bit-by-bit comparison of the match register with the internal state data. If each bit of the exclusive-OR output is a "0", then this indicates that a match has occurred.

The multiple bits of the exclusive-OR gate 211 then are concurrently ANDED together in AND gate 219 with corresponding bits of the mask value, which is programmed in the mask register 255 (FIG. 8D). Thus, each bit of the mask register is compared with the corresponding bit of the exclusive-OR gate output, and produces a multiple-bit output that indicates if the mask bit was asserted and if a match occurred. If the exclusive-OR gate 211 indicates a match, or if the mask bit is not asserted (indicating that the bit is masked and is not to be considered), then the AND gate 219 produces a low voltage (or "0") output signal for that bit. If, conversely, the exclusive-OR gate indicates no match by asserting a "1", and if the mask bit is asserted (indicating that the bit is not masked, and is to be considered), then the AND gate 219 will produce a high voltage (or "1") output signal for that bit. Each of the bits represented on the multiple output lines of the AND gate 219 are inverted and applied to AND gate 221, which produces a single bit output signal indicating if a match has occurred. If each of the bits of the AND gate 219 are low, then this indicates a match of each of the unmasked bits, and thus a high voltage signal (a "1") is produced on the single output line of AND gate 221.

Referring again to FIG. 2, each of the hardware matchers preferably are pre-wired, or alternatively, are selectively connected to a particular hardware component in the integrated circuit via a multiplexer or some other switching logic (not shown). Thus, each of the hardware matchers are capable of comparing state values from one or more hardware component(s) with a particular match value, that is masked as desired by the user.

The software matchers (200*d* and 200*e* in the exemplary embodiment of FIG. 2) introduce additional flexibility to the word recognizer 175 by making it possible for the user to trigger an event, or to store data, based on a non-hardware state. In some integrated circuits, such as microprocessors, certain tasks are managed by special firmware, which is referred to in the Alpha architecture as PAL (Privileged Architecture Library) code, microcode in other architectures, and by many other names in other microprocessor/system architectures. Examples of tasks that may be managed by PAL code include enabling and disabling interrupt levels and identifying which instruction thread is executing in a processor. The software matcher provides the debugger with a mechanism of configuring a debug cycle involving non-hardware states such as, for example, a thread ID or an address-based number, or an interrupt-enable level, or other non-hardware states. The detection of these software states permits the word recognizer to filter what information is being stored, or to stop and start an acquisition phase, based on a software condition. Thus, instead of having an input signal based on the hardware state being observed like the hardware matchers, the software matchers respond to a condition whose truth value is determined by software (often PAL, though it may be any software granted access to the register containing these bits). Because the condition is evaluated by software, it can be arbitrarily complex. As an example, the software matchers can be programmed to store data whenever the interrupt priority level is set to 8 (In certain processor architectures, such as the Alpha processor manufactured by the assignee of the present invention, priority level may be implemented as a software convention, with no direct representation in hardware. Thus, it may not be possible to monitor priority levels in certain processor architectures without software assistance). Thus, if interrupt level 8 is set, the software matcher produces a true output signal, and the word recognizer, without stopping and re-programming, could be configured to start storing data. When interrupt level 8 is exited, the software matcher is reprogrammed by firmware to produce a false output, and data storage can be terminated. Moreover, the conditions of one or more of the software matchers can be combined with the conditions of one or more of the hardware matchers. Thus, the hardware and software conditions can be used, alone or in combination, to determine what conditions to examine to start acquiring, stop acquiring, or store state data from particular sources.

Referring now to FIG. 5, a preferred embodiment for the software matcher logic 200*s* is shown. The software matcher 200*s* preferably comprises an OR gate 261, with a match register input and a mask register input. The mask register input is inverted. The match register value represents a software condition or event which, if detected by the software matcher, causes a true output at the output of OR gate 261. The mask register value provides a mechanism to disable or enable the software matcher, while allowing the software condition to be evaluated even when it is masked out. This is a convenience for software. A zero in the mask causes the term to be always true, while a one in the mask causes the value in the match register to be used. A term which is always true, when assigned to the AND group, does not interfere with the rest of the match, and so can be considered to be disabled.

Referring again to FIG. 2, the output signals of the various hardware and software matchers 200*a*–200*l* can be combined in an OR function or in an AND function, as will now be described. The output signals of each of the match logic units 200*a*–200*l* are provided to both an AND term 300*a* and an OR term 400*a*. The effect of the AND term or the OR term is determined by the status of a dedicated bit in the Match CSR 225 (FIG. 8A). Thus, AND/OR bit (a), which controls the operation of AND term 300*a* and OR term 400*a*, may comprise Match CSR bit 48. According to the exemplary embodiment, if AND/OR bit(a) is set to "0", then AND term 300*a* is enabled. If AND/OR bit(a) is set to "1", then OR term 400*a* is enabled. Each of the other corresponding AND terms 300*b*–300*l* and OR terms 400*b*–400*l* are selected in similar fashion based on values programmed in the match CSR 225 of FIG. 8A.

Referring now to FIGS. 6 and 7, the AND term 300 and the OR term 400 will now be described in accordance with the preferred embodiment. The AND term 300 in FIG. 7 comprises an OR gate 305 that receives the Term Match signal from the output of the match logical units 200*a*–200*l*. The other input of the OR gate 305 comprises AND/OR bit(x), where x denotes one of the Match AND/OR Term Bits from the Match CSR 225, corresponding to the particular match logic unit 200*a*–200*l*. If the AND/OR Term Bit is set to "1", then the AND term 300 is disabled by the OR gate 305, which remains high as long as the AND/OR Term Bit remains high. If the AND/OR Term Bit is set to "0", then the output value (the "And Term" signal) represents the value of the Term Match input signal from the match logic unit 200a–200l. Similarly, the OR term 400 in FIG. 6 comprises an AND gate 405 that receives the Term Match signal from the output of the match logic units 200a–200l. The other input of the AND gate 405 comprises AND/OR bit(x), where x denotes one of the Match AND/OR Term Bits from the Match CSR 225 corresponding to the particular match logic unit 200a–200l. If the AND/OR Term Bit is set to "0", then the OR term 400 is disabled by the AND gate 405, which remains high as long as the AND/OR Term Bit remains low. If the AND/OR Term Bit is set to "1", then the output value (the "OR Term" signal) represents the value of the Term Match input signal from the match logic unit 200a–200l. Thus, the AND/OR Term Bit enables either the AND term 300 or the OR term 400, and disables the other term.

Thus, for example, hardware matcher 200a has a corresponding AND/OR Term bit, which in the exemplary embodiment is OR_Condition #1 bit, located at bit 48 in the Match CSR 225. If this bit is set to 1, then OR_Condition #1 selects OR term 400a; if it is cleared to 0, then OR_Condition #1 selects the AND term 300a. Thus, by programming the AND/OR Term Bit values in the Match CSR register, which in the exemplary embodiment comprise Match CSR bits (37–48), the user can select which of the hardware and/or software match units are subject to AND terms and which are subject to OR terms.

Referring still to FIG. 2, the output lines of each of the AND Terms 300a–300l (which, as shown in FIG. 7 as the output terminal of OR gate 305) connect to the input of AND gate 355. The AND gate 355 only produces a true output if all of the input signals to AND gate 355 are true. The input signals will produce a true output if a match occurs for a defined condition, or if the match condition is masked. Thus, by selecting the mask and the AND/OR Term Bits, the user can select the combination of conditions that must occur before starting or stopping acquisition or data storage. Similarly, the output lines of the OR Terms 400a–400l connect to the input of the OR gate 365. The OR gate 365 will produce a true output if any of the input signals to the OR gate are true. Conditions that are assigned to the AND group will not produce true inputs at OR gate 365.

The output of AND gate 355 and the output of OR gate 365 are combined in an AND gate 370 and in an OR gate 380. The output of AND gate 370 will only go high if the output of AND gate 355 is high and the output of OR gate 365 is high. The output of OR gate 380 will go high if either AND gate 355 or OR gate 365 is high. The output of the AND gate 370 and the OR gate 380 are provided to a Match Type multiplexer 385, both directly, and through inverters 382, 384, thereby providing the multiplexer 385 with an AND function (input terminal 0), OR function (input terminal 1), NAND function (input terminal 2) and a NOR function (input terminal 3). The select signal for the multiplexer 385 preferably comprises the Match Type bit field from the Match CSR, which in the exemplary embodiment comprises Match CSR bits (33–34). In the exemplary embodiment, if the Match Type bits comprise a 00, then an AND operation is performed on the outputs of AND gate 370 and OR gate 380. If the Match Type bits comprise a 01, then an OR operation is performed on the outputs of the AND gate 370 and OR gate 380. If the Match Type bits comprise a 10, then a NAND operation is performed on the outputs of the AND gate 370 and OR gate 380. Lastly, if the Match Type bits comprise a 11, then a NOR operation is performed on the outputs of the AND gate 370 and OR gate 380. The exemplary operation of the multiplexer 385 is summarized in Table I:

TABLE I

| Match Type value | Operation |
|---|---|
| 00 | AND |
| 01 | OR |
| 10 | NAND |
| 11 | NOR |

The output of the multiplexer 385 connects directly to input terminal (1) of multiplexer 395 and to one input terminal of AND gate 392. The other input of AND gate 392 receives an inverted output of flip-flop 390. The data input of flip-flop 390 also connects electrically to the output of multiplexer 385. The select signal for the multiplexer 395 preferably comprises the TIMR bit of the Match CSR 225 (which in the exemplary embodiment is bit 36). If TIMR is set to "1", then the direct output of the multiplexer is selected, which causes the multiplexer 395 to count cycles during which a match is exerted. If TIMR is cleared to "0", then the output of AND gate 392 is selected, which causes the multiplexer 395 to count events, because after the first cycle during which a match is indicated, the flip-flop 390 causes AND gate to go low. Thus, the output of multiplexer 395, which is indicated as the Tree Match signal, will either represent an event counter (if TIMR is cleared as "0") and will only go high at the start of a new true condition, or will represent a cycle counter (if TIMR is set as "1") and will remain high as long as a true condition exists.

Referring now to FIGS. 3 and 8A, the counter/timer portion of the word recognizer will now be described. The counter/timer portion of the word recognizer preferably comprises an incrementer 450, which is initially loaded with a value represented by CTMR, which preferably comprises bits (31:0) of the Match CSR register 225 (FIG. 8A). The Tree Match signal, which comprises the output of multiplexer 395 (FIG. 2), connects to the enable terminal of incrementer 450. The out terminal of the incrementer comprises the Match signal. If the incrementer 450 counts from the CTMR value to zero, thereby satisfying the CTMR value, then the incrementer is re-loaded with the CTMR Reload value, when the load input terminal is driven high. The CTMR Reload value preferably comprises the value represented by the CTMR Reload bits in the Mask CSR 235 register (FIG. 8B), which in the exemplary embodiment shown, are found at bits (31:0).

The load input terminal is controlled by AND gates 435, 440, OR gate 445, and OR gate 452. The AND gate 435 receives the TIMR signal from the Match CSR 225 (FIG. 8A), the CONSEC signal from the Match CSR 225 (shown at bit 35), the inverted Tree Match signal, and the output of flip-flip 430, which receives the Tree Match signal at its data input terminal. The AND gate 440 combines together the Tree Match signal (from multiplexer 395 of FIG. 2) and the Match signal (which is the output of incrementer 450). The output terminal of the AND gate 435 comprises one of the input signals to OR gate 445, while the output terminal of AND gate 440 comprises the other input signal. The output signal from OR gate 445 will drive the load terminal of the incrementer 450 when the Run signal for the OCLA is asserted. If the Run signal is not asserted, the incrementer 450 may be loaded with a value via OR gate 452. In the event that the Run signal is not asserted, then the assertion of a Match Register write enable signal causes the output of OR gate 452 to go high, thus driving the load input terminal of the incrementer 450 high. A multiplexer 460 controls the value applied to the Reload terminal of the incrementer 450. If the Run signal is asserted, the multiplexer selects the CTMR Reload value to apply to the reload terminal of the incrementer 450. If the Run signal is not asserted, then the Match Register Write value is applied to the Reload terminal of the incrementer 450.

Referring now to FIGS. 2 and 3, the Tree Match signal will remain high as long as the match condition exists if the TIMR signal is asserted. If the TIMR signal is not asserted, then the Tree Match signal will go high for a single clock cycle when a match condition exists, and will go back low until the next match condition exists. The Tree Match signal comprises the enable input signal to the incrementer 450. Thus, if the TIMR signal is asserted, the incrementer 450 will increment (i.e., count) on each clock edge that the match condition exists. If the TIMR signal is deasserted, the incrementer 450 will only increment each time a new match condition occurs. Thus, the TIMR signal controls whether the incrementer 450 counts the length of time that the match conditions exists, or the number of match condition events.

If the TIMR signal is deasserted, then AND gate 435 is disabled. Similarly, if the Tree Match signal is high indicating a match condition, AND gate 435 is disabled. Also, if CONSEC is low, AND gate 435 is disabled. If any of these conditions exist (TIMR low, CONSEC low, or Tree Match high) then the incrementer 450 cannot be re-loaded unless the incrementer counts out, causing Match to go high, with Tree Match being asserted. If the incrementer 450 counts to zero, then the incrementer is deemed to have satisfied its initial count value and is re-loaded with the CTMR RELOAD value from the Mask CSR 235.

If the TIMR signal is asserted, indicating that the incrementer 450 is counting the number of cycles when the Tree Match signal is asserted, the CONSEC signal controls whether the total cycles are counted, or whether only consecutive cycles are counted. If CONSEC is asserted, the incrementer 450 will only count consecutive cycles, because in that event, both the TIMR input signal and the CONSEC input signal will be high, thus causing AND gate 435 to go high on the clock edge after the Tree Match signal goes low, thereby indicating the match condition is no longer true. This causes the output of inverter 432 to go high, and also causes flip-flop 430 to remain high for one clock cycle after Tree Match goes low. As a result, the incrementer load terminal is enabled through OR gate 445 and AND gate 455. This causes the CTMR value to be re-loaded, as long as it has not previously counted to zero. Thus, if CONSEC is high, the incrementer will only count consecutive count cycles, and will not count total count cycles when the match condition exists. If CONSEC is low, then the incrementer 450 will retain its count and will resume the count once the match condition reappears. The CONSEC value preferably is programmed in the Match CSR register. In the exemplary embodiment shown in FIG. 8A, the CONSEC bit is found at bit (35).

Thus, according to the preferred embodiment, the Boolean logic portion of the word recognizer logic feeds a relatively large (32-bit) incrementer (or counter). This counter can be configured to count events or cycles. In the latter case, the cycles can be constrained to consecutive cycles or total cycles when the Boolean logic is true, thus indicating a match condition. The counter has both an initial value and a reload value, both of which can be independently programmed. For example, if a word recognizer is configured to control data storage, the initial and reload values permit the word recognizer to note the first 10 million events, and then store every subsequent (or every $n^{th}$) event thereafter. Various other alternatives and extensions are possible, as will be apparent to one skilled in the art.

Referring now to FIG. 8A, the Match CSR 225 will be described in more detail to aid in understanding the principles of the present invention. The Match CSR 225 preferably comprises a 64-bit register with values that are programmed by the user to control the match conditions of the word recognizer. According to the preferred embodiment, bits (63:49) control the match conditions of the match logical units 200$a$–200$l$. Thus, according to the exemplary embodiment shown, bit 63 of the Match CSR connects to an input terminal of hardware matcher 200$a$. In similar fashion, one or more bit fields of the Match CSR connect to one or more terminals of the other match logical units. In the exemplary embodiment of FIG. 8A, bits (48:37) of the Match CSR 225 comprise the AND/OR Term Bits for the AND terms 300$a$–300$l$ and OR terms 400$a$–400$l$. The TIMR bit (36) controls whether the incrementer counts cycles or events. The CONSEC bit (35) controls whether the cycles will be counted consecutively, or as an accumulated total. The Match Type bits (34:33) control whether the AND terms and OR terms will not subject to an AND, OR, NAND or NOR operation. Lastly, the CTMR field (31:0) represents the count value loaded in the incrementer.

The Mask CSR 235 depicted in FIG. 8B has two general fields. The first field (63:32) includes control bits for defining if mask values exist for a match term. The second field (31:0) represents the count value to be re-loaded in the incrementer if the incrementer counts out.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An integrated circuit fabricated on a chip, comprising:
multiple on-chip logic analyzers each including a trigger word recognizer; and
an on-chip memory that captures data in response to match signals from the trigger word recognizers,
wherein the trigger word recognizers each comprise a Boolean logic section and a counter/timer section, wherein the Boolean logic section includes multiple hardware match logical units that compare a match value with internal state data and produce an output signal that is true if the comparison indicates a match condition, and wherein each output signal of a hardware match logical units connects to both an AND term and an OR term, and a user selects whether the AND term or the OR term, is enabled for each of the hardware match logical units,
wherein for each trigger word recognizer, the hardware match logical units for which the AND term is selected have their output signals combined together in an AND gate, and all the hardware match logical units for which the OR term is selected have their output signals combined together in an OR gate,
wherein the output of the AND gate and the output of the OR gate are selectively combined together in one of either an AND operation, an OR operation, a NAND operation, or a NOR operation, wherein the selective combining is performed via a multiplexer, and wherein the multiplexer output is selectively coupled to a second multiplexer via two different signal paths, and wherein the first signal path remains asserted if a match condition exists, and the second signal path is asserted for a first clock that the match condition exists, and wherein the second multiplexer selects one of the first or second signal path based on a select bit that is programmed by the user.

2. An Integrated circuit fabricated on a chip, comprising:

multiple on-chip logic analyzers each including a trigger word recognizer: and an on-chip memory that captures data in response to match signals from the trigger word recognizers, wherein the trigger word recognizers each comprise a Boolean logic section and a counter/timer section, wherein the Boolean logic section includes multiple hardware match logical units that compare a match value with internal state data and produce an output signal that is true if the comparison indicates a match condition, and wherein each output signal of a hardware match logical units connects to both an AND term and an OR term, and a user selects whether the AND term or the OR term is enabled for each of the hardware match logical units, wherein the Boolean logic section includes multiple software match logical units that each receive a software-provided match value and produce an output signal that is true if the software-provided match value is true, and wherein each output signal of the software match logical units connects to both an AND term and an OR term, and the user selects whether the AND term or the OR term is enabled for each of the software match logical units, wherein each software match logical unit receives a software-provided match value indicative of one or more non-hardware states in a set consisting of a thread ID, an address-based number, and an interrupt-enable level.

3. An Integrated circuit fabricated on a chip, comprising:

an on-chip logic analyzer that comprises a trigger word recognizer and a storage word recognizer; and an on-chip memory that captures data determined by the storage word recognizer in response to a match signal from the trigger word recognizer, wherein the word recognizers each comprise a Boolean logic section and a counter/timer section, wherein the Boolean logic section includes multiple hardware match logical units that compare a match value with internal state data and produce an output signal that is true if the comparison indicates a match condition, and wherein each said output signal of the hardware match logical units connects to both an AND term and an OR term, and a user selects whether the AND term or the OR term is enabled for each of the hardware match logical units.

4. The integrated circuit of claim 3, wherein for each word recognizer, the hardware match logical units for which the AND term is selected have their output signals combined together in an AND gate, and all the hardware match logical units for which the OR term is selected have their output signals combined together in an OR gate.

5. The integrated circuit of claim 4, wherein the output of the AND gate and the output of the OR gate are selectively combined together in one of either an AND operation, an OR operation, a NAND operation, or a NOR operation, wherein the selective combining is performed via a multiplexer.

6. The integrated circuit of claim 5, wherein the multiplexer output is selectively coupled to a second multiplexer via two different signal paths, and wherein the first signal path remains asserted if a match condition exists, and the second signal path is asserted for the first clock period that the match condition exists, and wherein the second multiplexer selects one of the first or second signal path based on a select bit that is programmed by the user.

7. The integrated circuit of claim 3, wherein the Boolean logic section includes multiple software match logical units that receive a software-provided match value and produce an output signal that is true if the software-provided match value is true, and wherein each said output signal of the software match logical units connects to both an AND term and an OR term, and the user selects whether the AND term or the OR term is enabled for each of the software match logical units.

8. The integrated circuit of claim 7, wherein each software-provided match value is indicative of one or more non-hardware states in a set consisting of a thread ID, an address-based number, and an interrupt level.

* * * * *

UNITED STATES PATENT AND TRADEMARK OFFICE
CERTIFICATE OF CORRECTION

| | | |
|---|---|---|
| PATENT NO. | : 7,096,395 B2 | Page 1 of 1 |
| APPLICATION NO. | : 10/034227 | |
| DATED | : August 22, 2006 | |
| INVENTOR(S) | : Timothe Litt | |

It is certified that error appears in the above-identified patent and that said Letters Patent is hereby corrected as shown below:

In column 16, line 55, in Claim 1, after "OR term" delete ",".

In column 17, line 11, in Claim 2, after "recognizer" delete ":" and insert -- ; --, therefor.

Signed and Sealed this

Twenty-third Day of June, 2009

JOHN DOLL
*Acting Director of the United States Patent and Trademark Office*